United States Patent [19]
Yoshino

[11] Patent Number: 5,369,521
[45] Date of Patent: Nov. 29, 1994

[54] SCANNING TYPE PROJECTOR

[75] Inventor: Hisakazu Yoshino, Tochigi, Japan

[73] Assignee: Kabushiki Kaisha Topcon, Tokyo, Japan

[21] Appl. No.: 974,272

[22] Filed: Nov. 10, 1992

[30] Foreign Application Priority Data

Nov. 11, 1991 [JP] Japan .................. 3-294525

[51] Int. Cl.⁵ ............................. G02B 26/08
[52] U.S. Cl. ............................. 359/196; 359/649; 258/474
[58] Field of Search .................. 359/209–210, 359/663, 649, 196–197, 211, 201, 36, 48–49; 250/234–236; 358/474, 475, 489

[56] References Cited

U.S. PATENT DOCUMENTS 3,748,015 7/1973 Offner .
5,255,114 10/1993 Kessler ......................... 359/208

FOREIGN PATENT DOCUMENTS 45-6999 3/1970 Japan .

OTHER PUBLICATIONS

Suzuki, A., "Complete Analysis of a Two-Mirror Unit Magnification System. Parts 1 and 2", *Applied Optics*, vold. 22, No. 24, Dec. 15, 1983, pp. 3943-3956.

Primary Examiner—Scott J. Sugarman
Assistant Examiner—James Phan
Attorney, Agent, or Firm—Popham, Haik, Schnobrich & Kaufman, Ltd.

[57] ABSTRACT

A scanning type projector of a refractive optical system which has a wide field and projects with high resolution power. The scanning type projector projects an object to be projected by scanning with a predetermined scanning width, wherein the scanning type projector has an illuminating portion which illuminates the object to be projected through a circular arc region having its center on the center line of said scanning width, a refraction projecting optical system in which an aberration of the circular arc region having its center on the optical axis is corrected, and an image of the object to be projected illuminated in a circular arc shape by the illuminating portion is formed within an image plane, a light receiving member which is arranged at the plane of the object to be projected and the image, and a driving unit which relatively moves the illuminating portion and the projecting optical portion.

6 Claims, 7 Drawing Sheets

SCANNING TYPE PROJECTOR

BACKGROUND OF THE INVENTION

The present invention relates to a scanning type projector which has a wide field and projects with high resolution power.

As a conventional projector which projects with high resolution power, a stepper is known in which a refractive optical system is used to successively project in small division to expose. The stepper is capable of reduction and enlargement, in which a numerical aperture (NA) can be provided to be large.

However, when it is intended in this optical system to ensure a large field, a projecting magnification becomes one-fold, and it is difficult to ensure a field not less than 150×150 mm due to the occurrence of the extra-axial abberation. For example, there is such a problem that it is not suitable for an exposing apparatus for an LCD (liquid crystal display device) of 300 mm×210 mm square to be used for lap-top type word processors.

As another example of the conventional projector which projects with high resolution power, such one of the scanning type is known which is disclosed in the official gazette of Japanese Patent Publication No. 51083/1982, and constituted as shown in FIG. 7 such that a concave mirror 100 and a convex mirror 102 are opposed and arranged.

In this optical system, an object to be projected and an image focusing position are arranged at symmetrical positions using the optical axis 104 as the center, and a corrected abberation region 106 in which an abberation is corrected is formed at a ring-shaped portion using the optical axis 104 as the center. The luminous flux to be used for projection is only a luminous flux which passes through the corrected abberation region 106 limited by a visual field diaphragm (not shown) in an illumination optical system arranged at a conjugated position with respect to the object to be projected. The scanning is performed by moving the object to be projected and a photosensitive material arranged at the image focusing position in each arrow in a synchronized manner.

In this case, when the maximum value of distortion of the optical member is Pv, the abberations generated by this Pv are as follows:

$2 \times Pv$ for the distortion of the reflection plane, $(n-1) \times Pv$ for the distortion of the refraction plane.

Here, n is a refraction index of the lens of the refractive optical system, and there is generally given n=1.5, so that the occurrence of the abberation at the refraction plane is $(0.5 \times Pv)$ with a sensitivity which is ¼ times the reflection plane, and hence it is understood that the refraction plane is more advantageous with respect to the large scale formation of the optical member.

On the other hand, when a scanning type projector having a wide field is used as an exposing apparatus for LCD (liquid crystal display device), masks to be used are expensive in their production cost, so that small one is desirable.

Further, when the resolution power of the optical system of the scanning type projector is considered, it is desirable that the numerical aperture NA is made large. In the conventional optical system shown in FIG. 7, the luminous flux which passes around the convex mirror 102 interferes with the luminous flux which is inputted into and reflected by the convex mirror 102, and the numerical aperture NA cannot be made large.

SUMMARY OF THE INVENTION

The constitution of the scanning type projector of the present invention which solves the above-mentioned problem lies in a scanning type projector which projects an object to be projected by scanning with a predetermined scanning width, wherein it has an illuminating portion which illuminates the object to be projected through a circular arc region having its center on the center line of said scanning width, a projecting optical system in which an aberration of the circular arc region having its center on the optical axis is corrected, and an image of the object to be projected illuminated in a circular arc shape by said illuminating portion is formed within an image plane, a light receiving member which is arranged at the plane of said object to be projected and said image, and a driving unit which relatively moves said illuminating portion and said projecting optical portion.

According to the present invention, the optical system included in the scanning type projector is a not a reflection optical system, but a lens optical system which is a refraction optical system, and such an advantage is provided that a high projection accuracy can be obtained even when a processing accuracy and a maintaining accuracy of the refractive plane are made low. In addition, the projection magnification can be easily made not less than 1, so that there is provided such an advantage that the mask of the illuminating portion which is expensive in its production cost can be made compact. Further, there is provided such an advantage that the numerical aperture NA is made large, and the resolution power of the optical system of the scanning type projector can be made high.

Other features and advantages of the invention will be apparent from the description of the preferred embodiment and from the claims.

BRIEF DESCRIPTION OF DRAWINGS

In order that the invention may be readily carried out into effect, it will now be described with reference to the accompanying drawings, wherein.

DESCRIPTION OF THE PREFERRED EMBODIMENT

Figure 1:
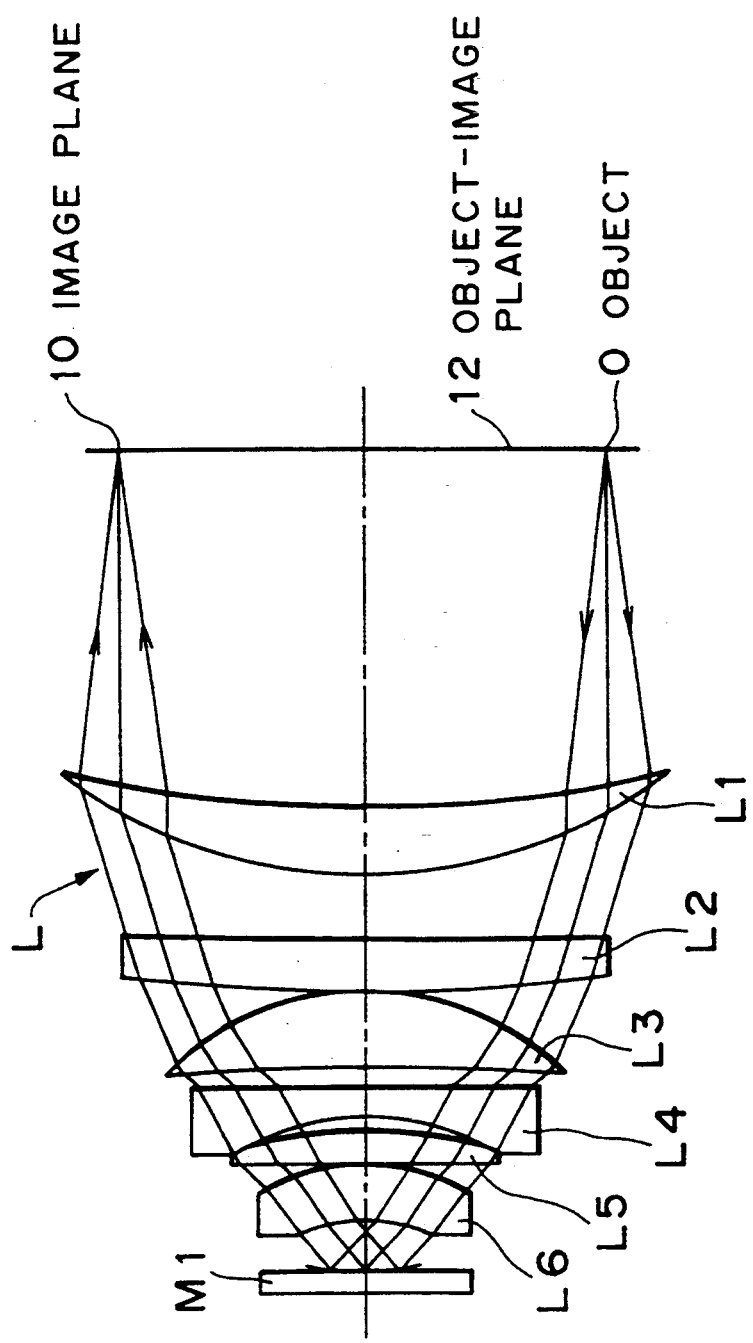
FIG. 1 is a figure of optics of the first example of the present invention.

Scanning type projectors of examples of the present invention will be explained hereinafter. As shown in FIG. 1, the scanning type projector of the first example comprises seven groups, namely a refraction lens system of six lenses and one reflection mirror, and a diaphragm is arranged on the reflection mirror, namely at the focus position of a refraction lens image. This provides a telecentric optical system at the side of an object to be projected and the side of an image, which reduces the influence of magnification distortion and the like. The object to be projected is illuminated through a circular arc region using the optical axis as the center, and only the circular arc region which uses the optical axis as the center is substantially used as the projecting luminous flux at the image focusing position. The scanning is performed by synchronizing and moving the object to be projected and a light receiving member arranged at the image focusing position. The optical data of the lens system are as follows.

| Optical member | Radius of curvature | Thickness (interval) | Refraction index |
|---|---|---|---|
| L1 | −1021.7 | | |
| | | 71.1 | 1.67 |
| | −419.3 | | |
| | | 60.7 | |
| L2 | −8053.2 | | |
| | | 50.1 | 1.52 |
| | −1784.8 | | |
| | | 2.8 | |
| L3 | +252.0 | | |
| | | 79.5 | 1.73 |
| | +2313.8 | | |
| | | 17.5 | |
| L4 | +5463.7 | | |
| | | 28.4 | 1.75 |
| | +221.7 | | |
| | | 17.5 | |
| L5 | +402.4 | | |
| | | 26.2 | 1.73 |
| | +4340.8 | | |
| | | 0.4 | |
| L6 | +189.7 | | |
| | | 55.8 | 1.74 |
| | +149.5 | | |
| | | 100.0 | |
| M | ∞ | | |

The width W of the region (the width of the slit), in which the abberation correction is made to be projected onto the object to be projected 0 and the image focusing plane 10, is 4.0 mm and its chord length b is 310 mm. In the first example, there are given the numerical aperture NA of 0.12, the resolution power of 2.9 μmL/S, the field of (310×D) mm (D: scanning length) and the wavelength of g- line (436 mm).

The luminous flux from the object to be projected 0 on an object-image plane 12 passes through the lens system L, namely the lenses L1, L2, L3, L4, L5 and L6, which is thereafter reflected by the reflection mirror M1, and passes through the lenses L6, L5, L4, L3, L2 and L1, and arrives at the image focusing plane 10.

Figure 2:
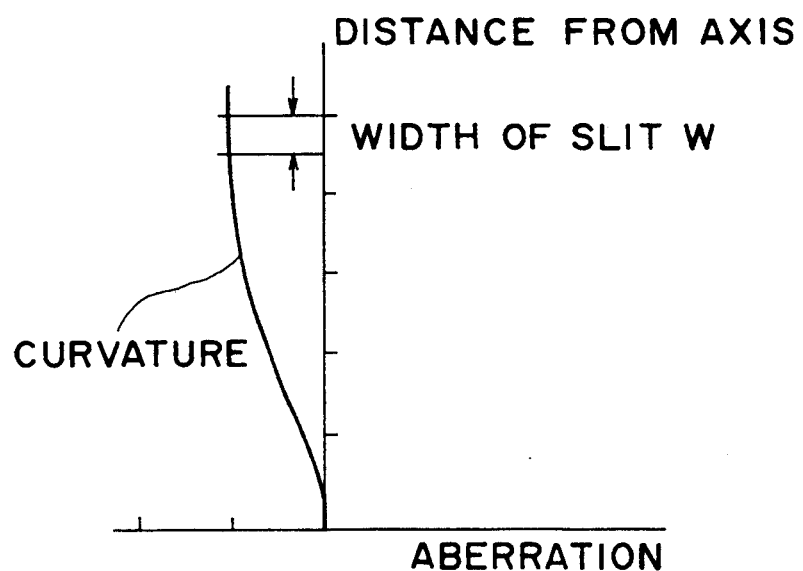
FIG. 2 is a figure of abberation of the first example of the present invention.

As shown in FIG. 2, with respect to the image plane curvature abberation which shows an amount of inversion of the image of the optical system in the first example, when the amount of abberation is given in the axis of abscissa and the distance from the optical axis is given in the axis of ordinate, the image plane position at the slit width W of the circular arc-shaped slit deviates from the axis of ordinate showing the abberation 0, however, only the focus image at the portion of the deviated slit width W is used, and the image focusing position is coincided with the object-image plane, so that no unclarity of the image is generated due to the image plane curvature abberation. Incidentally, the non-point abberation is corrected to be 0.

Figure 3:
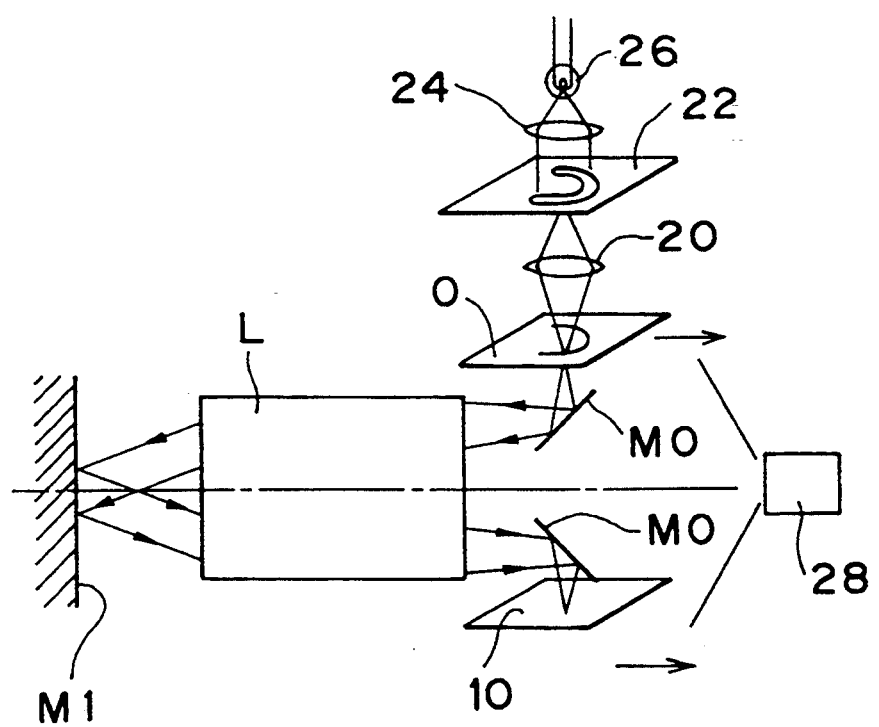
FIG. 3 is a figure of optics of the second example of the present invention.

The scanning type projector of the second example is shown in FIG. 3, in which the common constructions to those of the first example are designated by common symbols, explanation of which is omitted. In the second example, the object to be projected 0 and the image focusing plane 10 are arranged to be parallel with each other through reflection mirrors MO and to be symmetrical using the optical axis of the lens system L as the center. Over the object to be projected 0 are successively arranged a projecting lens 20, a slit plate 22, a condenser lens 24 and a light source 26. The object to be projected 0 is conjugated with the slit plate 22 relative to the projecting lens 20. The object to be projected 0 and a light receiving member S (not shown in FIG. 3 but shown in FIG. 4) on the image focusing plane 10 are connected to a driving unit 28 for moving both in the arrow direction shown in FIG. 3 in a synchronized manner. As shown in FIG. 3, the object to be projected 0 and the light receiving member S are moved by driving unit 28 relative to light source 26 and the projecting optical system comprising lens 20, plate 22, and lens 24. Conversely, driving unit 28 can move light source 26 and the projecting optical system comprising lens 20, plate 22, and lens 24 relative to the object to be projected 0 and the light receiving member S.

Figure 4:
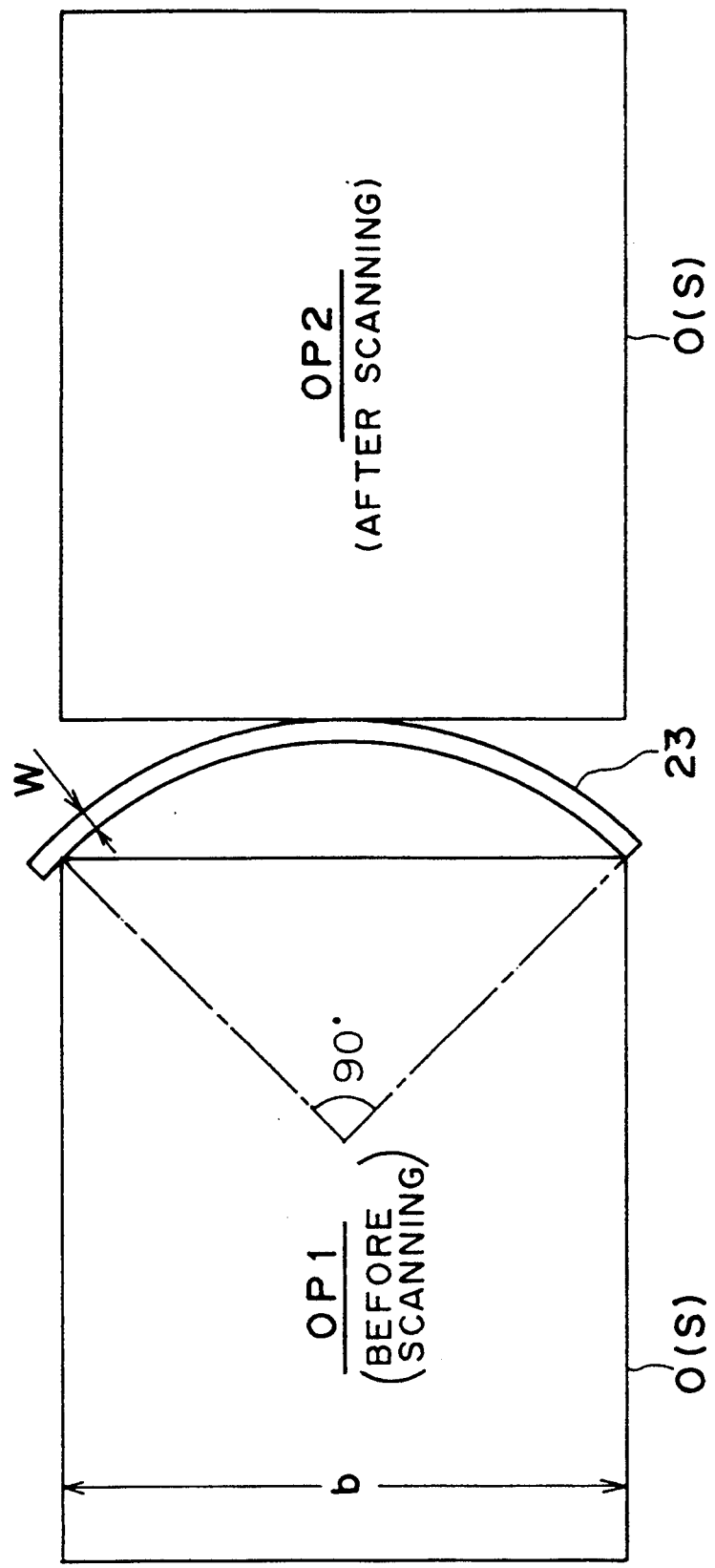
FIG. 4 is a figure of explanation of the scanning in the second example of the present invention.

Namely, as shown in FIG. 4, the object to be projected 0 and the light receiving member S are moved in position from OP1 to OP2 with respect to the slit 23 of the circular arc shape of 90° formed at the slit plate 22, thereby the scanning is performed.

Figure 5:
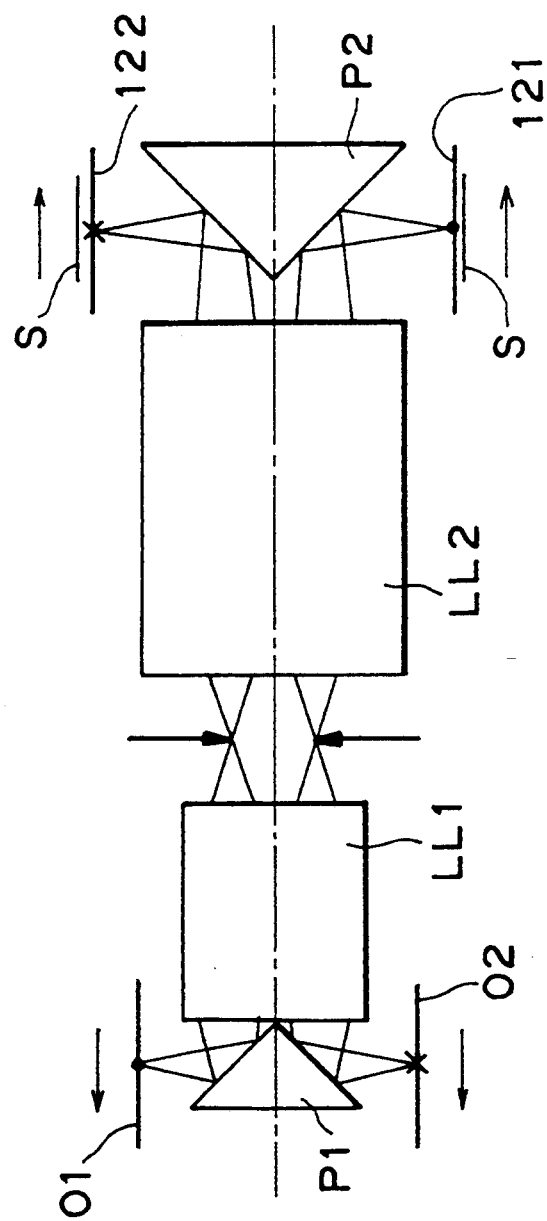
FIG. 5 is a figure of optics of the third example of the present invention.

The scanning type projector of the third example is shown in FIG. 5, in which the common constructions to those of the first example and the second example are designated by common symbols, explanation of which is omitted. In the third example, a lens system LL1 having a focal distance of f1 and a lens system LL2 having a focal distance of f2 are opposed and arranged. A right angle prism P1 is arranged at the input side of the lens system LL1, and a right angle prism P2 is arranged at the output side of the lens system LL2. An image of an object to be projected 01 is formed on an image focusing plane 121, and an image of an object to be projected 02 is formed on an image focusing plane 122. The third example has a projecting magnification of (f1/f2), which is an optical system capable of enlargement and reduction, and has such advantages that the same optical system can be used as two projecting optical systems at the same time, and transfer of two sheets is possible at once.

Figure 6:
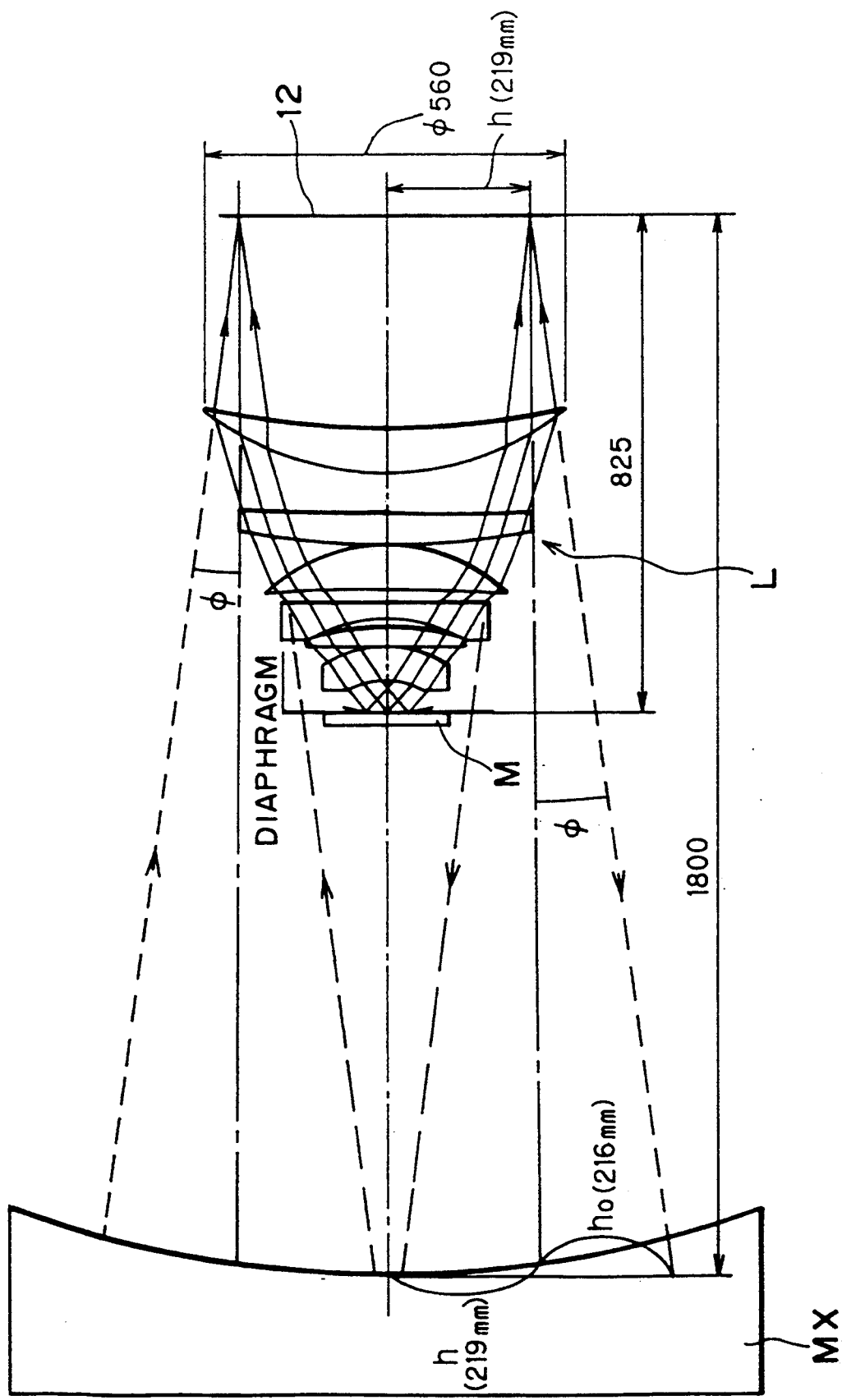
FIG. 6 is a figure of explanation to compare sizes of a conventional scanning type projector of the reflection type and the scanning type projector of the present invention.
Figure 7:
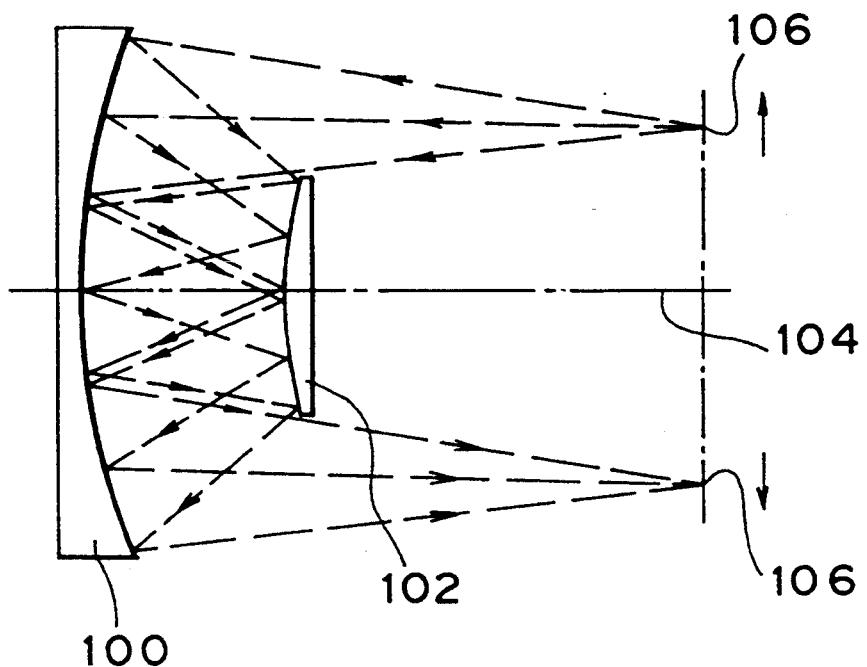
FIG. 7 is a figure of optics of the conventional scanning type projector of the reflection type.

Next, the fact that the scanning type projector of the present invention comprising the lens system is compact as compared with the scanning type projector of the reflection optical system will be explained. As shown in FIG. 6, it is assumed that the scanning type projector of the present invention comprises the lens system L and the reflection mirror M, in which the maximum outer diameter of the lens is 560 mm, the height of the object to be projected and the image focusing position from the optical axis is 219 mm, and the distance from the image focusing plane to the reflection plane of the reflection mirror M is 825 mm. The numerical aperture NA (sinΦ) is 0.12.

On the other hand, in a reflection optical system which has the above-mentioned optical performance, when the slit width is 4 mm, as shown in FIG. 6, the interval between the object-image plane 12 and the reflection plane of the reflection mirror MX, that is the radius of curvature of the reflection mirror MX necessitates 1800 mm, and the height h of the optical axis at the reflection mirror MX is 219 mm, and the width of the luminous flux is (2×216) mm. Therefore, the radius of the reflection mirror MX must be not less than 435 mm. As described above, it can be said that the scanning type projector of the present invention comprising the lens system is extremely compact as compared with the scanning type projector of the reflection optical system.

In the above-mentioned examples, such a projecting optical system has been provided in which the numerical aperture NA is small and the field is wide in order to mainly produce LCD, however, the present invention is not limited thereto, which can be effectively applied also to projecting optical apparatuses in a field of semiconductor production which requires a projecting optical system having a large numerical aperture NA and a wide field, such as for example an optical system having a numerical aperture NA=0.6, a field diameter of 25 to 30 mm, and l=248 mm.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A scanning type projector which projects an object to be projected by scanning the object with a predetermined scanning width having a center line, the projector comprising:

illuminating means for illuminating the object to be projected through a circular arc region having a center line on the center line of the scanning width;

projecting optical system means for correcting an aberration of the circular arc region and for forming an image of the illuminated object within an image plane;

a light receiving member located at the image plane; and driving unit means for moving the object and the light receiving member relative to the illuminating means and the projecting optical system means.

2. The scanning type projector of claim 1, wherein the projecting optical system is a telecentric optical system at the side of the object and at the side of the image of the object.

3. The scanning type projector of claim 1, wherein the projecting optical system is positioned with respect to the object to be projected to input first and second projection luminous fluxes from the object to be projected in a symmetrical manner with respect to an optical axis in the projecting optical system.

4. The scanning type projector of claim 1, wherein the light receiving member is a liquid crystal display.

5. The scanning type projector of claim 4, wherein the projecting optical system is a telecentric optical system at the side of the object and at the side of the image of the object.

6. The scanning type projector of claim 4, wherein the projecting optical system is positioned with respect to the object to be projected to input first and second projection luminous fluxes from the object to be projected in a symmetrical manner with respect to an optical axis in the projecting optical system.

* * * * *